United States Patent
Hong et al.

(10) Patent No.: US 11,424,139 B2
(45) Date of Patent: Aug. 23, 2022

(54) APPARATUS AND METHOD FOR TREATING SUBSTRATE, AND NOZZLE UNIT

(71) Applicant: SEMES CO., LTD., Cheonan-si (KR)

(72) Inventors: Yong Hoon Hong, Seoul (KR);
Heehwan Kim, Sejong-si (KR); Ji Young Lee, Asan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/026,504

(22) Filed: Sep. 21, 2020

(65) Prior Publication Data
US 2021/0090911 A1 Mar. 25, 2021

(30) Foreign Application Priority Data
Sep. 25, 2019 (KR) .......................... 10-2019-0118363

(51) Int. Cl.
| | |
|---|---|
| *B08B 3/08* | (2006.01) |
| *B08B 13/00* | (2006.01) |
| *H01L 21/67* | (2006.01) |
| *H01L 21/687* | (2006.01) |

(52) U.S. Cl.
CPC .......... *H01L 21/67051* (2013.01); *B08B 3/08* (2013.01); *B08B 13/00* (2013.01); *H01L 21/68764* (2013.01)

(58) Field of Classification Search
CPC ......... H01L 21/67051; H01L 21/68764; H01L 21/6715; H01L 21/02052; B08B 13/00; B08B 3/08
See application file for complete search history.

(56) References Cited

U.S. PATENT DOCUMENTS

| | | | | |
|---|---|---|---|---|
| 4,744,747 A | * | 5/1988 | Kawamura | F23N 5/203 431/36 |
| 6,860,434 B2 | * | 3/2005 | Ahn | B05B 5/0533 239/102.1 |
| 2004/0017414 A1 | * | 1/2004 | Hirayama | B41J 2/0458 347/12 |
| 2007/0216740 A1 | * | 9/2007 | Fukuda | B41J 2/14056 347/86 |
| 2007/0256922 A1 | * | 11/2007 | Ahn | B03C 3/383 204/164 |
| 2008/0218095 A1 | * | 9/2008 | Erhardt | H05B 45/42 315/224 |
| 2021/0146272 A1 | * | 5/2021 | Szczap | F26B 3/12 |

FOREIGN PATENT DOCUMENTS

| | | |
|---|---|---|
| JP | 2001-358109 A | 12/2001 |
| JP | 2016-198717 A | 12/2016 |
| KR | 101260414 B1 | 5/2013 |
| KR | 10-2018-0108946 A | 10/2018 |
| KR | 10-2019-0019600 A | 2/2019 |

\* cited by examiner

*Primary Examiner* — Alexander Markoff
(74) *Attorney, Agent, or Firm* — Harness, Dickey & Pierce, P.L.C.

(57) ABSTRACT

The inventive concept relates to an apparatus for treating a substrate. The apparatus includes a support unit that supports the substrate and a nozzle unit having a nozzle that dispenses a chemical onto the substrate, in which the nozzle is connected with a ground line, and a variable resistor is provided on the ground line.

17 Claims, 9 Drawing Sheets

APPARATUS AND METHOD FOR TREATING SUBSTRATE, AND NOZZLE UNIT

CROSS-REFERENCE TO RELATED APPLICATIONS

A claim for priority under 35 U.S.C. § 119 is made to Korean Patent Application No. 10-2019-0118363 filed on Sep. 25, 2019, in the Korean Intellectual Property Office, the entire contents of which are hereby incorporated by reference.

BACKGROUND

Embodiments of the inventive concept described herein relate to an apparatus and method for treating a substrate, and a nozzle unit.

In general, semiconductor elements are formed by performing various processes (e.g., a photo process, an etching process, an ion implantation process, a deposition process, and the like) on a substrate such as a silicon wafer.

Various treatment liquids may be used in the respective processes. For example, treatment liquids may be used in a process of coating a substrate with photo-resist in the photo process, or in a cleaning process for removing various types of contaminants adhering to the substrate before and after the processes.

SUMMARY

Embodiments of the inventive concept provide an apparatus and method for efficiently treating a substrate.

Embodiments of the inventive concept provide an apparatus and method for maintaining a balance between equilibrium stress and surface tension even when an electrostatic force is induced.

In addition, embodiments of the inventive concept provide an apparatus and method for preventing contamination of a substrate and an ESD phenomenon due to a Taylor cone-jet by controlling an electrostatic force.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a support unit that supports the substrate and a nozzle unit having a nozzle that dispenses a chemical onto the substrate, in which the nozzle is connected with a ground line, and a variable resistor is provided on the ground line.

In an embodiment, a resistance value of the variable resistor may be changed to a first resistance value or a second resistance value lower than the first resistance value.

In an embodiment, the variable resistor may have the first resistance value when the nozzle is moved, when the nozzle starts to dispense the chemical, or when the nozzle stops dispensing the chemical.

In an embodiment, the variable resistor may have the second resistance value while the chemical is being dispensed by the nozzle.

In an embodiment, a resistance value of the variable resistor may be changed to a first resistance value, a second resistance value lower than the first resistance value, and a third resistance value lower than the first resistance value and higher than the second resistance value.

In an embodiment, the variable resistor may have the first resistance value when the nozzle is moved or when the nozzle starts to dispense the chemical.

In an embodiment, the variable resistor may have the second resistance value while the chemical is being dispensed by the nozzle.

In an embodiment, the variable resistor may have the third resistance value when the nozzle stops dispensing the chemical.

In an embodiment, the variable resistor may include a plurality of resistors connected in parallel with the ground line and switches provided for the respective resistors, and the switches may be controlled by a controller.

In an embodiment, the nozzle may have one or more grooves or protrusions formed on a surface of the nozzle.

In an embodiment, the grooves or the protrusions may be formed in a helical shape.

In an embodiment, the nozzle may include a nozzle part and a nozzle cover that surrounds the nozzle part, and the nozzle cover may be connected with the ground line.

In an embodiment, the ground line may be connected with an outer surface of the nozzle cover.

According to an exemplary embodiment, a method for treating a substrate using the apparatus includes changing a resistance value of the variable resistor to a second resistance value lower than a first resistance value, while the chemical is being dispensed by the nozzle.

In an embodiment, the method may further include changing the resistance value of the variable resistor to the first resistance value, when the nozzle is moved, when the nozzle starts to dispense the chemical, or when the nozzle stops dispensing the chemical.

In an embodiment, the method may further include changing the resistance value of the variable resistor to the first resistance value, when the nozzle is moved or when the nozzle starts to dispense the chemical and changing the resistance value of the variable resistor to a third resistance value lower than the first resistance value and higher than the second resistance value, when the nozzle stops dispensing the chemical.

According to an exemplary embodiment, a nozzle unit provided in a substrate treating apparatus includes a nozzle that dispenses a chemical onto a substrate. In an embodiment, the nozzle may be connected with a ground line, and a variable resistor may be provided on the ground line.

In an embodiment, a resistance value of the variable resistor may be changed to a first resistance value or a second resistance value lower than the first resistance value, the variable resistor may have the first resistance value when the nozzle is moved, when the nozzle starts to dispense the chemical, or when the nozzle stops dispensing the chemical, and the variable resistor may have the second resistance value while the chemical is being dispensed by the nozzle.

In an embodiment, a resistance value of the variable resistor may be changed to a first resistance value, a second resistance value lower than the first resistance value, or a third resistance value lower than the first resistance value and higher than the second resistance value. The variable resistor may have the first resistance value when the nozzle is moved or when the nozzle starts to dispense the chemical. The variable resistor may have the second resistance value while the chemical is being dispensed by the nozzle. The variable resistor may have the third resistance value when the nozzle stops dispensing the chemical.

In an embodiment, the variable resistor may include a plurality of resistors connected in parallel with the ground line and switches provided for the respective resistors, and the switches may be controlled by a controller.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
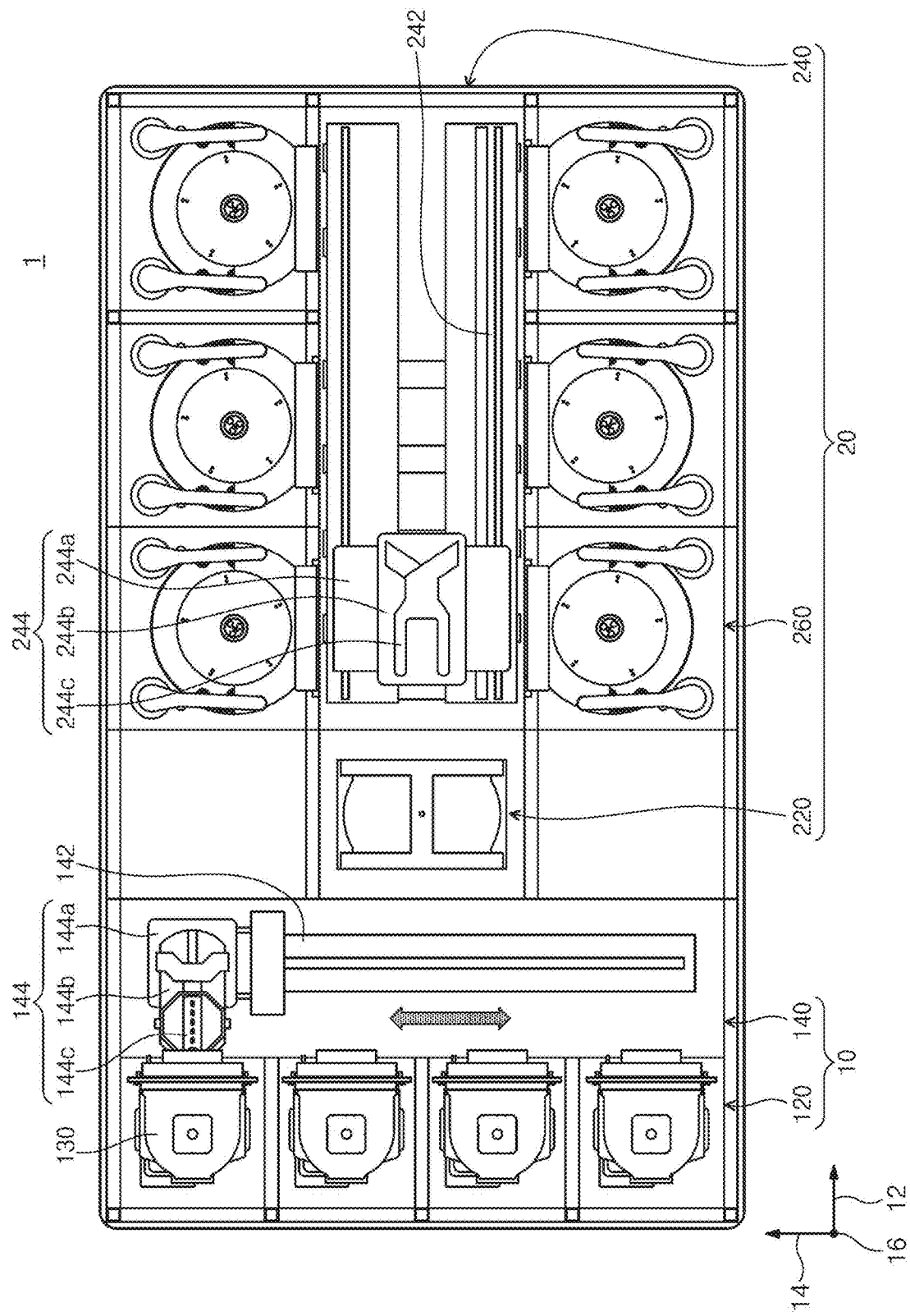
FIG. 1 is a plan view illustrating substrate treating equipment according to an embodiment of the inventive concept.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

In the entire specification, the terminology, component "~unit" or "~module," refers to a software component or a hardware component such as an FPGA or an ASIC, and performs at least one function or operation. It should be, however, understood that the component "~unit" or "~module" is not limited to a software or hardware component. The component "~unit" or "~module" may be implemented in storage media that can be designated by addresses. The component "~unit" or "~module" may also be configured to regenerate one or more processors.

For example, the component "~unit" or "~module" may include various types of components (e.g., software components, object-oriented software components, class components, and task components), processes, functions, attributes, procedures, sub-routines, segments of program codes, drivers, firmware, micro-codes, circuit, data, data base, data structures, tables, arrays, and variables. Functions provided by a component and the component "~unit" or "~module" may be separately performed by a plurality of components and components "~units" or "~modules" and may also be integrated with other additional components.

FIG. 1 is a plan view illustrating substrate treating equipment according to an embodiment of the inventive concept.

Referring to FIG. 1, the substrate treating equipment 1 includes an index module 100 and a process module 200. The index module 100 includes a load port 120 and a transfer frame 140. The load port 120, the transfer frame 140, and the process module 200 are continuously arranged in a row. Hereinafter, a direction in which the load port 120, the transfer frame 140, and the process module 200 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

A carrier 130 having substrates W received therein is seated on the load port 120. A plurality of load ports 120 may be provided. The load ports 120 may be disposed in a row along the second direction 14. FIG. 1 illustrates an example that the index module 100 includes four load ports 120. However, the number of load ports 120 may be increased or decreased depending on conditions such as process efficiency and footprint of the process module 200. Slots (not illustrated) that support the edges of the substrates W are formed in the carrier 130. The slots are provided in the third direction 16. The substrates W are stacked in the carrier 130 in a state of being spaced apart from each other along the third direction 16. A front opening unified pod (FOUP) may be used as the carrier 130.

The process module 200 includes a buffer unit 220, a transfer chamber 240, and process chambers 260. The transfer chamber 240 is disposed such that the lengthwise direction thereof is parallel to the first direction 12. The process chambers 260 are disposed on one side and an opposite side of the transfer chamber 240 along the second direction 14. The process chambers 260 on the one side of the transfer chamber 240 and the process chambers 260 on the opposite side of the transfer chamber 240 are located in a symmetric arrangement with respect to the transfer chamber 240. Some of the process chambers 260 are disposed along the lengthwise direction of the transfer chamber 240. Furthermore, the other process chambers 260 are stacked one above another. That is, the process chambers 260 may be disposed in an A×B array (A and B being natural numbers of 1 or larger) on the one side of the transfer chamber 240. Here, "A" is the number of process chambers 260 provided in a row along the first direction 12, and "B" is the number of process chambers 260 provided in a column along the third direction 16. In a case where four or six process chambers 260 are disposed on the one side of the transfer chamber 240, the process chambers 26 may be arranged in a 2×2 or 3×2 array. The number of process chambers 260 may be increased or decreased. Alternatively, the process chambers 260 may be provided on only the one side of the transfer chamber 240. In another case, the process chambers 260 may be provided in a single layer on the one side and the opposite side of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) therein, in which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 130 seated on the load ports 120 and the buffer unit 220. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 includes a base 144a, a body 144b, and an index arm 144c. The base 144a is movable along the index rail 142. The body 144b is coupled to the base 144a. The body 144b is movable on the base 144a along the third direction 16. Furthermore, the body 144b is rotatable on the base 144a. The index arm 144c is coupled to the body 144b and is movable forward and backward relative to the body 144b. A plurality of index arms 144c may be provided. The index arms 144c may be individually driven. The index arms 144c may be stacked one above another with a spacing gap therebetween along the third direction 16. Some of the index arms 144c may be used to transfer the substrates W from the process module 200 to the carriers 130, and the other index arms 144c may be used to transfer the substrates W from the carriers 130 to the process module 200. Accordingly, particles generated from the substrates W that are to be treated may be prevented from adhering to the treated substrates W in the process in which the index robot 144 transfers the substrates W between the carriers 130 and the process module 200.

The transfer chamber 240 transfers the substrates W between the buffer unit 220 and the process chambers 260 and between the process chambers 260. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12. The main robot 244 includes a base 244a, a body 244b, and a main arm 244c. The base 244a is movable along the guide rail 242. The body 244b is coupled to the base 244a. The body 244b is movable on the base 244a along the third direction 16. Furthermore, the body 244b is rotatable on the base 244a. The main arm 244c is coupled to the body 244b and is movable forward and backward relative to the body 244b. A plurality of main arms 244c may be provided. The main arms 244c may be individually driven. The main arms 244c may be stacked one above another with a spacing gap therebetween along the third direction 16. The main arms 244c used to transfer the substrates W from the buffer unit 220 to the process chambers 260 may differ from the main arms 244c used to transfer the substrates W from the process chambers 260 to the buffer unit 220.

Each of the process chambers 260 has a substrate treating apparatus 300 therein, in which a cleaning process is performed on a substrate W. The substrate treating apparatuses 300 in the respective process chambers 260 may have different structures depending on the types of cleaning processes performed by the substrate treating apparatuses 300. Selectively, the substrate treating apparatuses 300 in the respective process chambers 260 may have the same structure. Selectively, the process chambers 260 may be divided into a plurality of groups. The substrate treating apparatuses 300 in the process chambers 260 belonging to the same group may have the same structure, and the substrate treating apparatuses 300 in the process chambers 260 belonging to different groups may have different structures. For example, in a case where the process chambers 260 are divided into two groups, a first group of process chambers 260 may be disposed on the one side of the transfer chamber 240, and a second group of process chambers 260 may be disposed on the opposite side of the transfer chamber 240. Selectively, on the one side and the opposite side of the transfer chamber 240, the first group of process chambers 260 may be provided in a lower layer, and the second group of process chambers 260 may be provided in an upper layer. The first group of process chambers 260 may be distinguished from the second group of process chambers 260 depending on the types of chemicals used or the types of cleaning methods.

Figure 2:
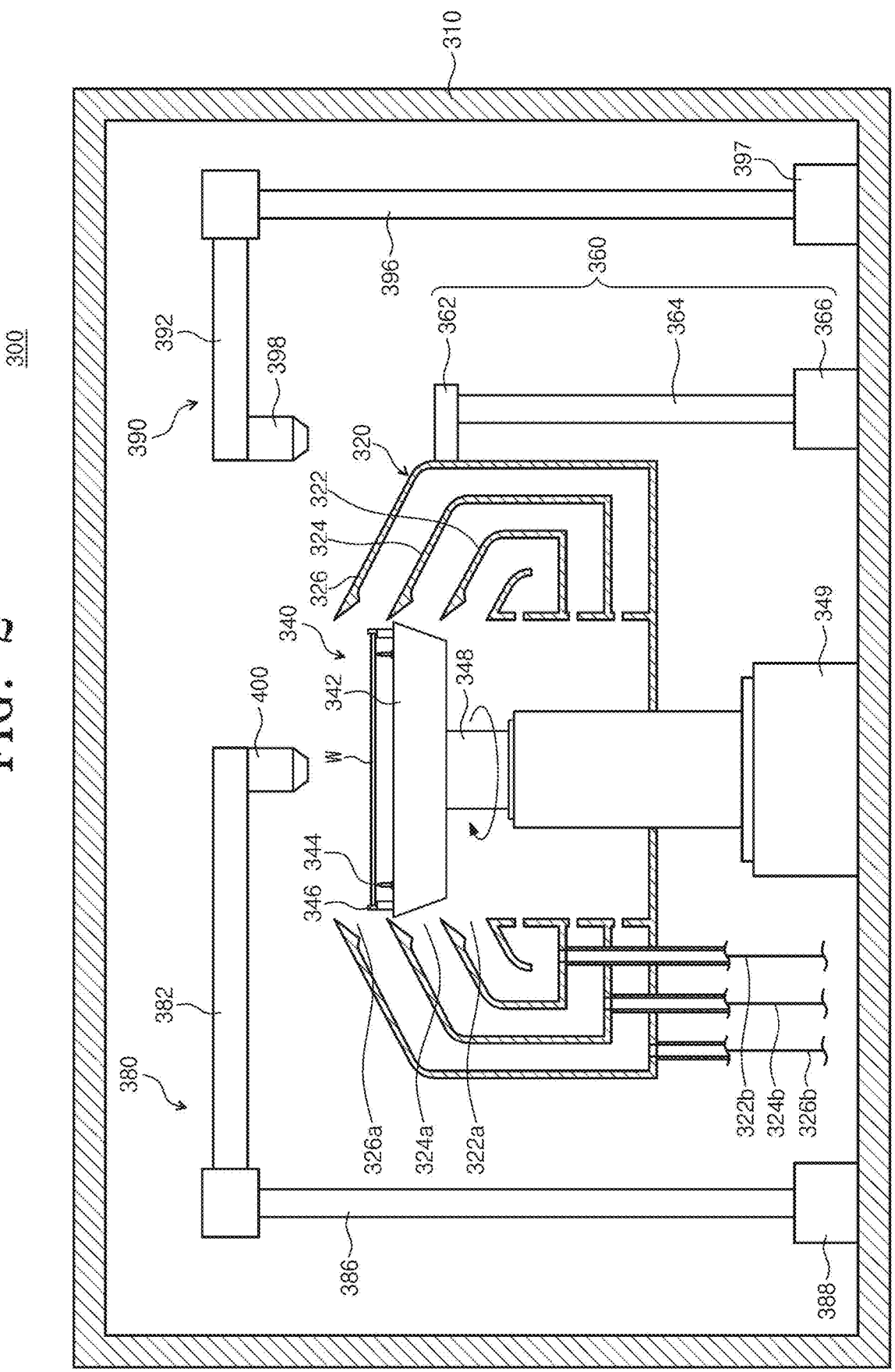
FIG. 2 is a view illustrating a substrate treating apparatus according to an embodiment of the inventive concept.

FIG. 2 is a view illustrating a substrate treating apparatus according to an embodiment of the inventive concept.

Referring to FIG. 2, the substrate treating apparatus 300 may include a chamber 310, a cup 320, a support unit 340, a lifting unit 360, and a nozzle unit 380. The substrate treating apparatus 300 may further include an auxiliary nozzle unit 390.

The chamber 310 has a space therein. The cup 320 is located in the space of the chamber 310. The cup 320 has a space in which a substrate treating process is performed. The cup 320 is open at the top thereof. The cup 320 includes an inner recovery bowl 322, an intermediate recovery bowl 324, and an outer recovery bowl 326. The recovery bowls 322, 324, and 326 recover different treatment fluids used in the substrate treating process. The inner recovery bowl 322 has an annular ring shape surrounding the support unit 340, the intermediate recovery bowl 324 has an annular ring shape surrounding the inner recovery bowl 322, and the outer recovery bowl 326 has an annular ring shape surrounding the intermediate recovery bowl 324. An interior space 322a of the inner recovery bowl 322, a space 324a between the inner recovery bowl 322 and the intermediate recovery bowl 324, and a space 326a between the intermediate recovery bowl 324 and the outer recovery bowl 326 function as inlets through which the treatment fluids are introduced into the inner recovery bowl 322, the intermediate recovery bowl 324, and the outer recovery bowl 326. The recovery bowls 322, 324, and 326 have recovery lines 322b, 324b, and 326b connected thereto, respectively. The recovery lines 322b, 324b, and 326b vertically extend downward from the bottoms of the recovery bowls 322, 324, and 326. The recovery lines 322b, 324b, and 326b release the treatment fluids introduced into the recovery bowls 322, 324, and 326, respectively. The released treatment fluids may be reused through an external treatment fluid regeneration system (not illustrated).

The support unit 340 is disposed in the treatment space of the cup 320. The support unit 340 supports and rotates a substrate W during the substrate treating process. The support unit 340 includes a spin chuck 342, support pins 344, chuck pins 346, a drive shaft 348, and an actuator 349. The spin chuck 342 has an upper surface with a substantially circular shape when viewed from above. The drive shaft 348, which is rotatable by the actuator 349, is fixedly coupled to a bottom surface of the spin chuck 342. When the drive shaft 348 rotates, the spin chuck 342 is rotated. To support the substrate W, the support unit 340 includes the support pins 344 and the chuck pins 346. The support pins 344 are disposed on an edge portion of the upper surface of the spin chuck 342 so as to be spaced apart from each other at predetermined intervals. The support pins 344 protrude upward from the spin chuck 342. The support pins 344 are arranged to form an annular ring shape as a whole by a combination thereof. The support pins 344 support the edge of the bottom surface of the substrate W such that the substrate W is spaced apart from the upper surface of the spin chuck 342 by a predetermined distance. The chuck pins 346 are disposed farther away from the center of the spin chuck 342 than the support pins 344. The chuck pins 346 protrude upward from the spin chuck 342. The chuck pins 346 support the side of the substrate W to prevent the substrate W from deviating from a correct position to a side when the support unit 340 is rotated. The chuck pins 346 are rectilinearly movable between a standby position and a support position along the radial direction of the spin chuck 342. The standby position is a position farther away from the center of the spin chuck 342 than the support position. The chuck pins 346 are located in the standby position when the substrate W is loaded onto or unloaded from the support unit 340. The chuck pins 346 are located in the support position when the substrate treating process is performed on the substrate W. In the support position, the chuck pins 346 are brought into contact with the side of the substrate W.

The lifting unit 360 rectilinearly moves the cup 320 in the vertical direction. The lifting unit 360 may move the plurality of recovery bowls 322, 324 and 326 of the cup 320. Alternatively, the lifting unit 360 may individually move the recovery bowls 322, 324, and 326 although not illustrated. As the cup 320 is vertically moved, the height of the cup 320 relative to the support unit 340 is changed. The lifting unit 360 includes a bracket 362, a movable shaft 364, and an actuator 366. The bracket 362 is fixedly attached to an outer wall of the cup 320, and the movable shaft 364 is fixedly coupled to the bracket 362 and is vertically moved by the actuator 366. The cup 320 is lowered such that the support unit 340 protrudes above the cup 320 when the substrate W is placed on the support unit 340 or raised off the support unit 340. Furthermore, when the substrate treating process is performed, the height of the cup 320 is adjusted depending on the types of the treatment fluids dispensed onto the substrate W, such that the treatment fluids are introduced into the preset recovery bowls 322, 324, and 326. For example, while the substrate W is treated with a first treatment fluid, the substrate W is located at the height corresponding to the interior space 322a of the inner recovery bowl 322. Furthermore, while the substrate W is treated with a second treatment fluid, the substrate W may be located at the height corresponding to the space 324a between the inner recovery bowl 322 and the intermediate recovery bowl 324, and while the substrate W is treated with a third treatment fluid, the substrate W may be located at the height corresponding to the space 326a between the intermediate recovery bowl 324 and the outer recovery bowl 326. Alternatively, the lifting unit 360 may vertically move the support unit 340 instead of the cup 320. In another case, the cup 320 may have a single recovery bowl 322.

The nozzle unit 380 dispenses a first treatment liquid onto the substrate W. For example, the first treatment liquid may be a cleaning solution, a developing solution, or a photosensitive liquid according to a process. One or more nozzle units 380 may be provided. The nozzle unit 380 includes a nozzle support rod 382, a support rod 386, an actuator 388, and a nozzle 400. The support rod 386 is provided such that the lengthwise direction thereof is parallel to the third direction 16, and the actuator 388 is coupled to a lower end of the support rod 386. The actuator 388 rotates, raises, and lowers the support rod 386. The nozzle support rod 382 is coupled perpendicular to an upper end of the support rod 386 that is opposite to the lower end of the support rod 386 to which the actuator 388 is coupled. The nozzle 400 is mounted on a bottom surface of a distal end of the nozzle support rod 382. The nozzle 400 is moved between a process position and a standby position by the actuator 388. The process position is a position where the nozzle 400 is located directly above the cup 320, and the standby position is a position where the nozzle 400 deviates from directly above the cup 320.

The auxiliary nozzle unit 390 dispenses a second treatment liquid onto the substrate W. According to an embodiment, the second treatment liquid may be of a different type than the first treatment liquid. The auxiliary nozzle unit 390 may be rotatable. The auxiliary nozzle unit 390 includes an auxiliary nozzle support rod 392, an auxiliary support rod 396, an auxiliary actuator 397, and an auxiliary nozzle 398. The auxiliary support rod 396 is provided such that the lengthwise direction thereof is parallel to the third direction 16, and the auxiliary actuator 397 is coupled to a lower end of the auxiliary support rod 396. The auxiliary actuator 397 moves the auxiliary support rod 396. For example, the auxiliary actuator 397 may rotate the auxiliary support rod 396. Furthermore, the auxiliary actuator 397 may raise and lower the auxiliary support rod 396. The auxiliary nozzle support rod 392 is coupled to an upper portion of the auxiliary support rod 396. The auxiliary nozzle 398 is mounted on a bottom surface of a distal end of the auxiliary nozzle support rod 392. The auxiliary nozzle 398 is moved between a process position and a standby position by the auxiliary actuator 397. The process position is a position where the auxiliary nozzle 398 is located directly above the cup 320, and the standby position is a position where the auxiliary nozzle 398 deviates from directly above the cup 320.

The first treatment liquid or the second treatment liquid is a chemical having charges. For example, the first treatment liquid or the second treatment liquid may be isopropyl alcohol (IPA).

Figure 3:
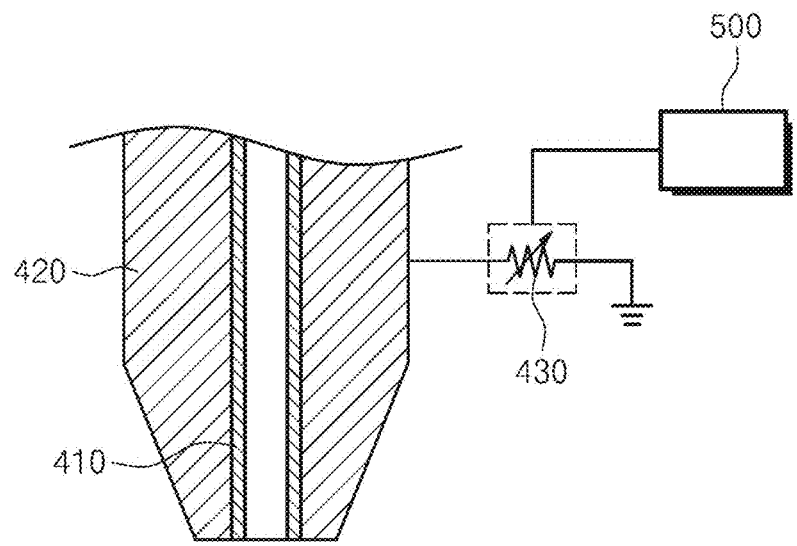
FIG. 3 is a sectional view illustrating part of a nozzle.

FIG. 3 is a sectional view illustrating part of the nozzle 400. Referring to FIG. 3, the nozzle 400 includes a nozzle part 410 and a nozzle cover 420.

The nozzle part 410 provides a passage through which a treatment liquid is supplied. The nozzle cover 420 surrounds the nozzle part 410. A ground line is connected to an outer surface of the nozzle cover 420. According to an embodiment, the nozzle 400 is illustrated as including the nozzle part 410 and the nozzle cover 420. However, the ground line may be connected to the nozzle part 410. The nozzle cover 420 may be implemented with a conductor or an insulator coated with a conductive material.

A variable resistor 430 is provided on the ground line. The resistance value of the variable resistor 430 may be controlled by a controller 500. For example, the resistance value of the variable resistor 430 may be changed to a first resistance value, a second resistance value lower than the first resistance value, or a third resistance value lower than the first resistance value and higher than the second resistance value.

No special limitation applies to the variable resistor 430, as long as the resistance value of the variable resistor 430 is able to be variously changed.

Figure 4:
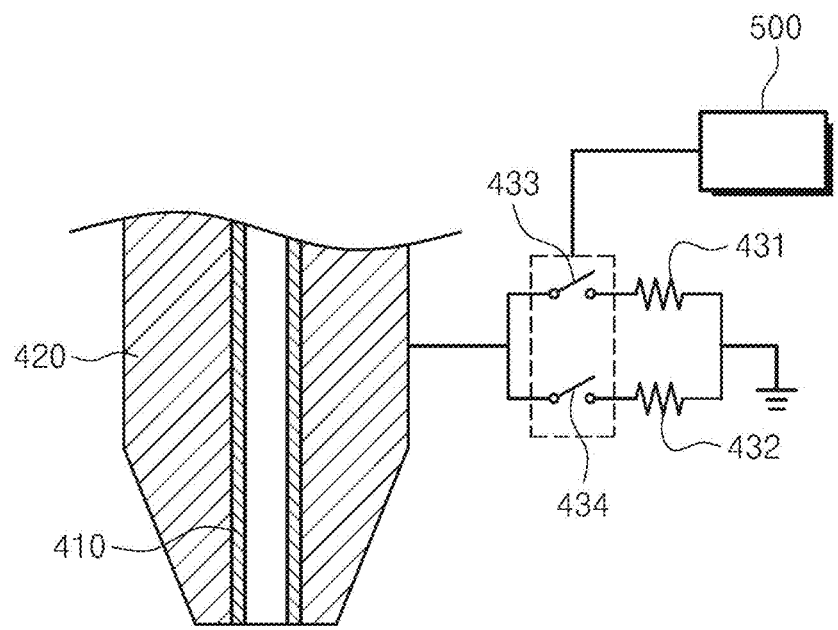
FIG. 4 is a view illustrating a variable resistor according to another embodiment.

FIG. 4 illustrates a variable resistor according to another embodiment. In an embodiment, the variable resistor includes a first resistor 431 and a second resistor 432 connected in parallel, a first switch 433 that is connected to a front end or a rear end of the first resistor 431 and that controls connection of the first resistor 431, and a second switch 434 that is connected to a front end or a rear end of the second resistor 432 and that controls connection of the second resistor 432.

For example, when the first switch 433 is turned on and the second switch 434 is turned off, the nozzle 400 is grounded through the first resistor 431. Alternatively, when the first switch 433 is turned off and the second switch 434 is turned on, the nozzle 400 is grounded through the second resistor 432. In another case, when the first switch 433 is turned on and the second switch 434 is turned on, the nozzle 400 is grounded through the first resistor 431 and the second resistor 432 connected in parallel.

Figure 5:
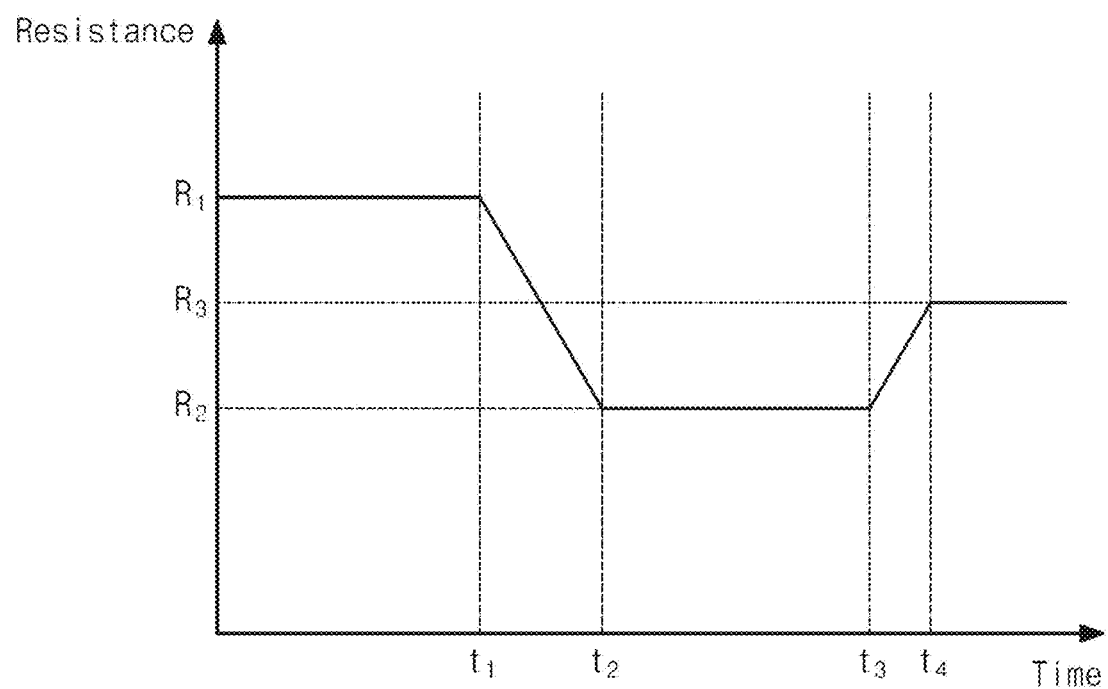
FIG. 5 is a graph depicting a resistance change over time.
Figure 6:
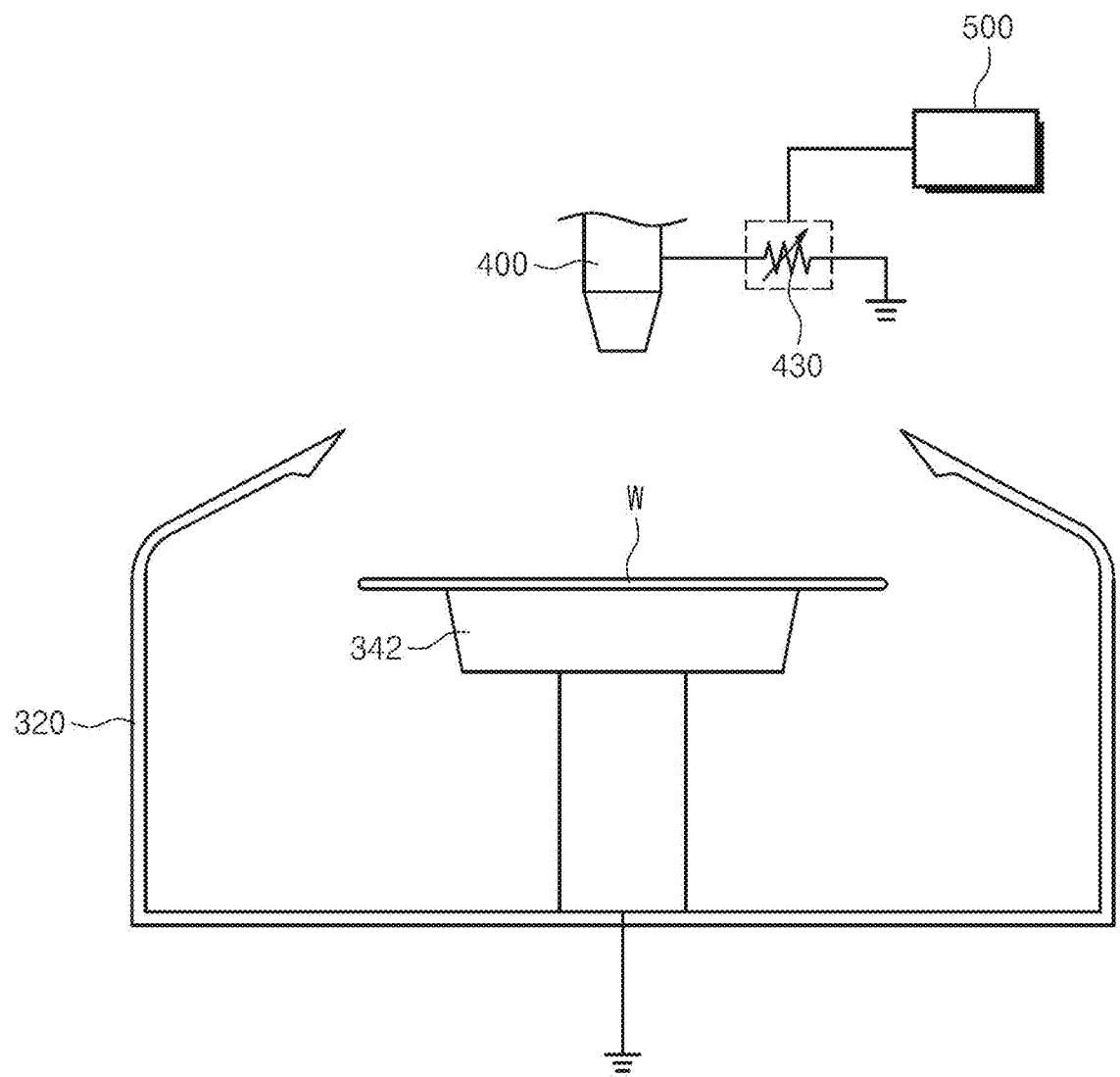
FIGS. 6, 7, and 8 are views illustrating control of the nozzle.
Figure 7:
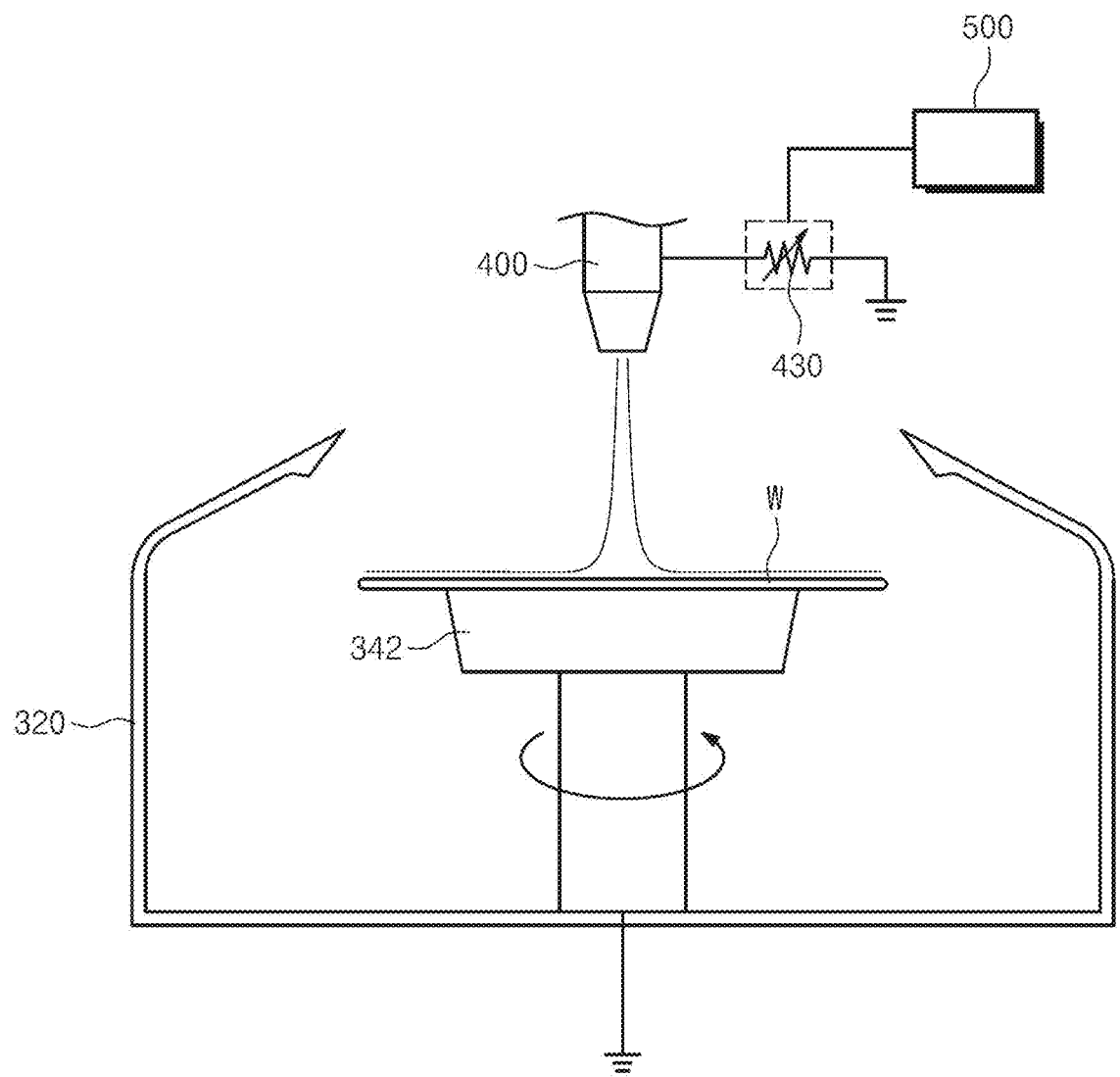
Figure 8:
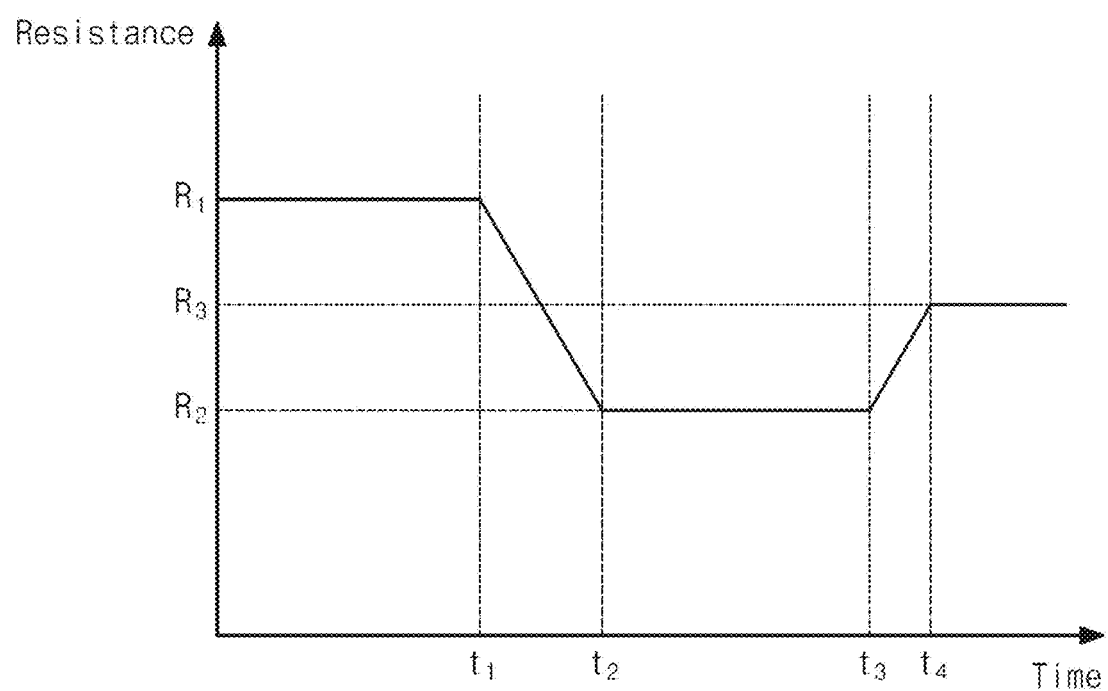

FIG. 5 is a graph depicting a resistance change over time, and FIGS. 6, 7, and 8 are views illustrating control of the nozzle 400.

Referring to FIG. 5, the interval from $t_0$ to $t_1$ is an interval in which the nozzle 400 is moved to a higher position than the substrate W or to the position of a home port. In the interval from $t_0$ to $t_1$, the resistance value of the variable resistor 430 is controlled to the first resistance value R1.

"$t_1$" is the time at which the nozzle 400 starts to dispense the treatment liquid. "$t_4$" is the time at which the nozzle 400 stops dispensing the treatment liquid.

In a process in which the treatment liquid is dispensed, the resistance value of the variable resistor 430 is gradually decreased from the first resistance value R1 to the second resistance value R2. While the treatment liquid continues to be dispensed, the resistance value of the variable resistor 430 is maintained at the second resistance value R2, and before the dispensing of the treatment liquid ends, the resistance value of the variable resistor 430 is gradually changed from the second resistance value R2 to the third resistance value R3.

Referring to FIGS. 5 and 6, before the treatment liquid is dispensed onto the substrate W, the resistance value of the variable resistor 430 is changed to the first resistance value R1. Before the treatment liquid is dispensed, a large amount of charged particles by static electricity are accumulated on the cup 320. The charged particles may contaminate the substrate W while being moved toward the nozzle 400 when the nozzle 400 is grounded. For example, the treatment liquid may contaminate the substrate W or the nozzle 400 while being scattered by movement of electric charges. In preparation for this case, the resistance value of the variable resistor 430 is controlled to the first resistance value R1 before the treatment liquid is dispensed. Accordingly, the nozzle 400 is weakly grounded, and thus the movement of the charged particles is restricted.

Referring to FIGS. 5 and 7, while the treatment liquid is dispensed onto the substrate W, the resistance value of the variable resistor 430 is changed to the second resistance value R2. The second resistance value R2 is lower than the first resistance value R1. For example, the second resistance value R2 may be substantially close to zero. The resistance value of the variable resistor 430 is gradually changed from the first resistance value R1 to the second resistance value R2. While the treatment liquid is dispensed, static electricity may be generated by friction between the nozzle 400 and the treatment liquid. Electric charges released while the treatment liquid is dispensed may be released through the ground line. Furthermore, the released charges may be released by grounding the spin chuck 342.

Referring to FIGS. 5 and 8, when the dispensing of the treatment liquid ends, the resistance value of the variable resistor 430 is changed to the third resistance value R3. The third resistance value R3 is lower than the first resistance value R1 and higher than the second resistance value R2. According to another embodiment, the third resistance value R3 may be equal to the first resistance value R1. When the dispensing of the treatment liquid ends, electric charges accumulated on a part, such as the cup 320, try to move toward the nozzle 400, which may cause damage to a wafer pattern, or secondary contamination of the substrate W due to movement of the treatment liquid. The movement of the electric charges may be prevented by changing the resistance value of the variable resistor 430 from the second resistance value R2 to the third resistance value R3. Accordingly, the secondary contamination of the substrate W due to the movement of the treatment liquid depending on a Taylor cone-jet phenomenon may be prevented.

In a case where a substrate treating process is repeated in a limited space of a chamber, an excessive amount of electric charges may be consistently accumulated on a part (e.g., a cup or a support unit) in the chamber due to electrification (e.g., dispensing, friction, induction, or the like). Therefore, an ESD phenomenon due to a Taylor cone-jet (a phenomenon in which more than a certain amount of static electricity accumulated on the surface of the part is rapidly discharged to a surface having relatively very low resistance to destroy a wafer pattern and an element) may arise. However, the inventive concept may prevent the phenomenon by differently grounding a nozzle when a nozzle is moved, when a treatment liquid is dispensed, or when the dispensing of the treatment liquid is stopped.

Figure 9:
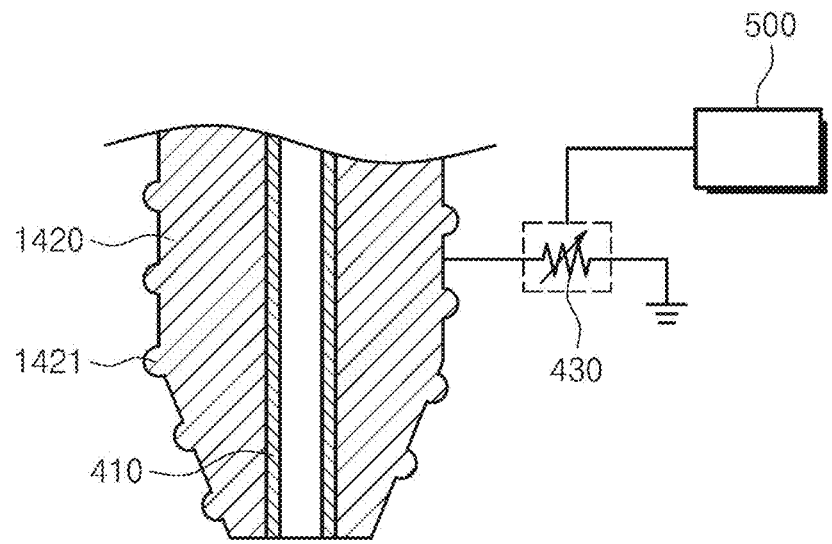
FIG. 9 is a view illustrating a nozzle cover according to another embodiment.

FIG. 9 is a view illustrating a nozzle cover 1420 according to another embodiment. A protrusion 1421 may be formed to increase the surface area of the nozzle cover 1420. The protrusion 1421 may be formed in a helical shape along the surface of the nozzle cover 1420. The protrusion 1421 increases the surface area of the nozzle cover 1420. The increased surface area facilitates controlling an electrostatic force on the surface of the nozzle cover 1420.

Figure 10:
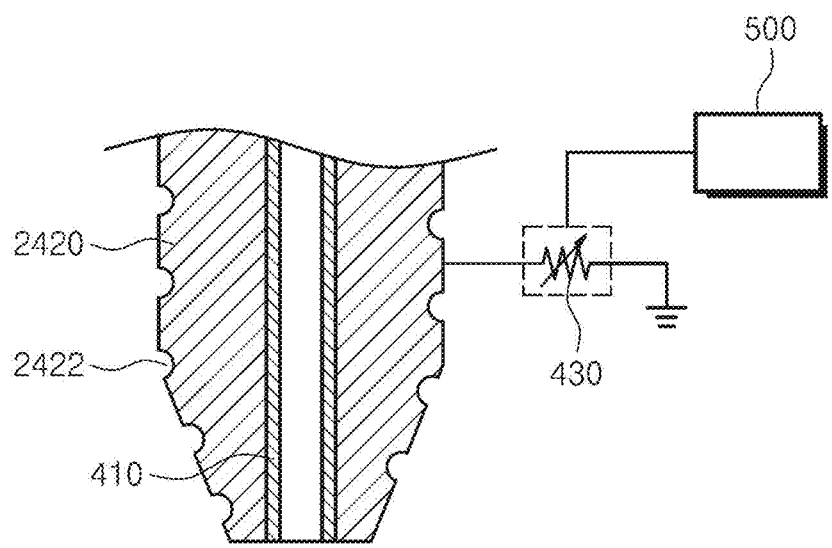
FIG. 10 is a view illustrating a nozzle cover according to another embodiment.

FIG. 10 is a view illustrating a nozzle cover 2420 according to another embodiment. A groove 2422 may be formed to increase the surface area of the nozzle cover 2420. The groove 2422 may be formed in a helical shape along the surface of the nozzle cover 2420. The groove 2422 increases the surface area of the nozzle cover 2420. The increased surface area facilitates controlling an electrostatic force on the surface of the nozzle cover 2420.

Figure 11:
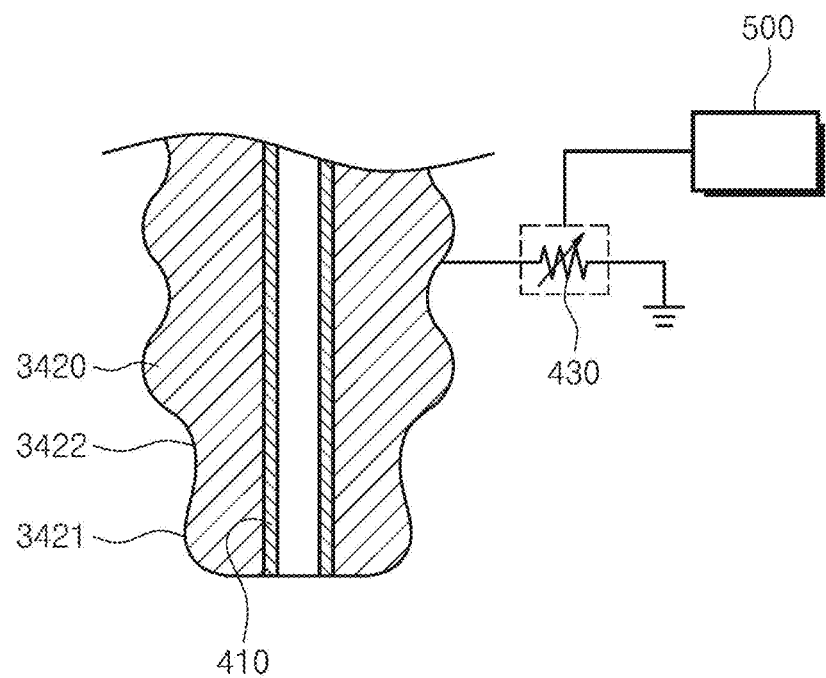
FIG. 11 is a view illustrating a nozzle cover according to another embodiment.

FIG. 11 is a view illustrating a nozzle cover 3420 according to another embodiment. A protrusion 3421 and a groove 3422 may be repeatedly formed to increase the surface area of the nozzle cover 3420. The protrusion 3421 and the groove 3422 may be repeatedly formed in a streamlined shape and may improve cleaning efficiency while increasing the surface area of the nozzle cover 3420. The increased surface area facilitates controlling an electrostatic force on the surface of the nozzle cover 3420.

The controller 500 may be implemented in storage media that can be designated by addresses. The component "~unit" or "~module" may also be configured to regenerate one or more processors. For example, the controller 500 may include various types of components (e.g., software components, object-oriented software components, class components, and task components), processes, functions, attributes, procedures, sub-routines, segments of program codes, drivers, firmware, micro-codes, circuit, data, data base, data structures, tables, arrays, and variables.

As described above, according to the embodiments of the inventive concept, a balance between equilibrium stress and surface tension may be maintained even when an electrostatic force is induced.

In addition, according to the embodiments of the inventive concept, contamination of a substrate and an ESD phenomenon due to a Taylor cone-jet may be prevented by controlling an electrostatic force.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a support unit configured to support the substrate;
    a nozzle unit having a nozzle configured to dispense a chemical onto the substrate and connected with a ground line;
    a variable resistor on the ground line; and
    a controller configured to control a resistance value of the variable resistor over time while treating the substrate.

2. The apparatus of claim 1, further comprising:
    the controller configured to change the resistance value of the variable resistor to a first resistance value or a second resistance value lower than the first resistance value.

3. The apparatus of claim 2, wherein the controller is configured to control the variable resistor to have the first resistance value when the nozzle moves, when the nozzle starts to dispense the chemical, or when the nozzle stops dispensing the chemical.

4. The apparatus of claim 2, wherein the controller is configured to control the variable resistor to have the second resistance value while the chemical is being dispensed by the nozzle.

5. The apparatus of claim 4, wherein the controller is configured to gradually change the resistance value of the variable resistor between the first resistance value and the second resistance value.

6. The apparatus of claim 1, wherein the controller is configured to change the resistance value of the variable resistor to a first resistance value, to a second resistance value lower than the first resistance value, and to a third resistance value lower than the first resistance value and higher than the second resistance value.

7. The apparatus of claim 6, wherein the controller is configured to control the variable resistor to have the first resistance value when the nozzle moves or when the nozzle starts to dispense the chemical.

8. The apparatus of claim 6, wherein the controller is configured to control the variable resistor to have the second resistance value while the chemical is being dispensed by the nozzle.

9. The apparatus of claim 6, wherein the controller is configured to control the variable resistor to have the third resistance value when the nozzle stops dispensing the chemical.

10. The apparatus of claim 9, wherein the controller is configured to gradually change the resistance value of the variable resistor from the first resistance value to the second resistance value and from the second resistance value to the third resistance value.

11. The apparatus of claim 1, wherein
    the variable resistor includes,
        a plurality of resistors connected in parallel with the ground line, and
        switches provided for the resistors, respectively, and
    the controller is further configured to control the switches.

12. The apparatus of claim 1, wherein the nozzle has one or more grooves or protrusions on a surface of the nozzle.

13. The apparatus of claim 12, wherein the grooves or the protrusions have a helical shape.

14. The apparatus of claim 1, wherein
    the nozzle includes,
        a nozzle part, and
        a nozzle cover configured to surround the nozzle part, and
    the nozzle cover is connected with the ground line.

15. The apparatus of claim 14, wherein the ground line is connected with an outer surface of the nozzle cover.

16. An apparatus for treating a substrate, the apparatus comprising:
    a support unit configured to support the substrate;
    a nozzle unit having a nozzle configured to dispense a chemical onto the substrate and connected to a ground line;
    a variable resistor; and
    a controller configured to control the variable resistor over time such that the variable resister has,
        a first resistance value when the nozzle moves, when the nozzle starts to dispense the chemical, or when the nozzle stops dispensing the chemical, and
        a second resistance value while the chemical is being dispensed by the nozzle, the second resistance value lower than the first resistance value.

17. The apparatus of claim 16, wherein the controller is further configured to gradually change between the first resistance value and the second resistance value.

* * * * *